United States Patent
Ellä et al.

(10) Patent No.: US 6,456,173 B1
(45) Date of Patent: Sep. 24, 2002

(54) METHOD AND SYSTEM FOR WAFER-LEVEL TUNING OF BULK ACOUSTIC WAVE RESONATORS AND FILTERS

(75) Inventors: Juha Ellä, Halikko; Pasi Tikka; Jyrki Kaitila, both of Helsinki, all of (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/784,634

(22) Filed: Feb. 15, 2001

(51) Int. Cl.[7] .............................. H03H 9/15; H03H 3/02; H03H 3/04

(52) U.S. Cl. ...................... 333/188; 333/191; 29/25.35; 310/312; 204/192.11; 204/192.34; 204/192.18; 427/9; 427/100

(58) Field of Search ................................. 333/186–192; 310/312; 29/25.35; 204/192.11, 192.15, 192.18, 192.34; 427/9, 100

(56) References Cited

U.S. PATENT DOCUMENTS

| | | | | | |
|---|---|---|---|---|---|
| 4,454,639 A | * | 6/1984 | Dworsky et al. | ........... | 29/25.35 |
| 4,638,536 A | * | 1/1987 | Vig | ............................ | 29/25.35 |
| 4,761,298 A | * | 8/1988 | Vig | ............................... | 427/10 |
| 5,407,525 A | * | 4/1995 | Michel et al. | ............... | 156/627 |
| 5,630,949 A | * | 5/1997 | Lakin | ............................ | 216/61 |
| 5,643,629 A | * | 7/1997 | Sauerland | ....................... | 427/8 |
| 5,662,782 A | * | 9/1997 | Gomi et al. | ............ | 204/192.34 |
| 5,780,713 A | * | 7/1998 | Ruby | .......................... | 73/1.82 |
| 5,873,153 A | * | 2/1999 | Ruby et al. | ................. | 29/25.35 |
| 5,894,647 A | * | 4/1999 | Lakin | .......................... | 29/25.35 |
| 6,051,907 A | * | 4/2000 | Ylilammi | ..................... | 310/312 |
| 6,081,171 A | | 6/2000 | Ella | ............................. | 333/189 |
| 6,307,447 B1 | * | 10/2001 | Barber et al. | ................ | 333/189 |
| 6,339,276 B1 | * | 1/2002 | Barber et al. | ................ | 310/312 |

FOREIGN PATENT DOCUMENTS

JP 8-18372 * 1/1996

* cited by examiner

Primary Examiner—Robert Pascal
Assistant Examiner—Barbara Summons
(74) Attorney, Agent, or Firm—Ware, Fressola, Van Der Sluys & Adolphson LLP

(57) ABSTRACT

A method and system for tuning a bulk acoustic wave device at the wafer level by adjusting the device thickness. In particular, the device thickness has a non-uniformity profile across the device surface. A mask with an aperture is placed over the device surface and a particle beam is applied over the mask to allow part of the particle beam to make contact with the device surface at a localized area beneath the aperture. The particles that pass through the aperture are deposited on the device surface to add material on the device surface, thereby increasing the surface thickness to correct for thickness non-uniformity. Alternatively, the particles that pass through the aperture remove part of the device surface in an etching process, thereby reducing the surface thickness. Prior to thickness adjustment, a frequency measurement device or thickness measurement device is used to map the device surface for obtaining the non-uniformity profile.

29 Claims, 7 Drawing Sheets

METHOD AND SYSTEM FOR WAFER-LEVEL TUNING OF BULK ACOUSTIC WAVE RESONATORS AND FILTERS

FIELD OF THE INVENTION

The present invention relates generally to bulk acoustic wave resonators and filters and, more particularly, to the tuning of such resonators and filters.

BACKGROUND OF THE INVENTION

It is known that a bulk acoustic-wave (BAW) device is, in general, comprised of a piezoelectric layer sandwiched between two electronically conductive layers that serve as electrodes. When a radio frequency (RF) signal is applied across the device, it produces a mechanical wave in the piezoelectric layer. The fundamental resonance occurs when the wavelength of the RF signal is about twice the thickness of the piezoelectric layer. Although the resonant frequency of a BAW device also depends on other factors, the thickness of the piezoelectric layer is the predominant factor in determining the resonant frequency. As the thickness of the piezoelectric layer is reduced, the resonant frequency is increased. BAW devices have traditionally been fabricated on sheets of quartz crystals. In general, it is difficult to achieve a device of high resonant frequency using this fabrication method. Fabricating BAW devices by depositing thin-film layers on passive substrate materials, one can extend the resonant frequency to the 0.5–10 GHz range. These types of BAW devices are commonly referred to as thin-film bulk acoustic resonators or FBARs. There are primarily two types of FBARs, namely, BAW resonators and stacked crystal filters (SCFs). The difference between these two types of devices lies mainly in their structures. An SCF usually has two or more piezoelectric layers and three or more electrodes, with some electrodes being grounded. FBARs are usually used in combination to produce passband or stopband filters. The combination of one series FBAR and one parallel FBAR makes up one section of the so-called ladder filter. The description of ladder filters can be found, for example, in Ella (U.S. Pat. No. 6,081,171). As disclosed in Ella, a FBAR-based device may have one or more protective layers commonly referred to as the passivation layers. A typical FBAR-based device is shown in FIG. 1. As shown in FIG. 1, the FBAR device 1 comprises a substrate 2, a bottom electrode 4, a piezoelectric layer 6, a top electrode 8 and a passivation layer 10. The FBAR device 1 may additionally include an acoustic mirror layer 12, which is comprised of a layer 16 of high acoustic impedance sandwiched between two layers 14 and 18 of low acoustic impedance. The mirror usually, but not always, consists of pairs of high and low impedance layers (even number of layers). Some mirror consists of two pairs of such layers arranged in a sequence like $SiO_2$, W, $SiO_2$, W. Instead of the mirror, a FBAR device may additionally include one or more membrane layers of $SiO_2$ and a sacrificial layer. The substrate 2 can be made from silicon (Si), silicon dioxide ($SiO_2$), Galium Arsenide (GaAs), glass, or ceramic materials. The bottom electrode 4 and top electrode 8 can be made from gold (Au), molybdenum (Mo), aluminum (Al), titanium (Ti) or other electrically conductive materials. The piezoelectric layer 6 can be made from zinc oxide (ZnO), zinc sulfide (ZnS), aluminum nitride (AlN), lithium tantalate ($LiTaO_3$) or other members of the so-called lead lanthanum zirconate titanate family. The passivation layer can be made from $SiO_2$, $Si_3N_4$ or polyimide. The low acoustic impedance layers 14 and 18 can be made from Si, $SiO_2$, poly-silicon, Al or a polymer. The high acoustic impedance layer 16 can be made from Au, Mo or tungsten (W), and in some cases, dielectric such as AlN to make a number of layer pairs. FBAR ladder filters are typically designed so that the series resonators yield a series resonance at a frequency that is approximately equal to, or near, the desired, or designed, center frequency of the respective filters. Similarly, the shunt, or parallel, resonators yield a parallel resonance at a frequency slightly offset from the series FBAR resonance. The series resonators are usually designed to have their maximum peak in transmission at the center frequency, so that signals are transmitted through the series resonators. In contrast, the parallel resonators are designed to have their minimum in transmission so that signals are not shorted to ground. FBARs yield parallel resonance and series resonance at frequencies that differ by an amount that is a function of a piezoelectric coefficient of the piezoelectric materials used to fabricate the devices, in addition to other factors such as the types of layers and other materials employed within in the device. In particular, FBAR ladder filters yield passbands having bandwidths that are a function of, for example, the types of materials used to form the piezoelectric layers of the resonators and the thickness of various layers in the device.

The difference in the thickness in various layers in the device can be achieved during the fabrication of the device. Presently, FBARs are fabricated on a glass substrate or a silicon wafer. The various layers in the FBAR-based device are sequentially formed by thin-film deposition. In an FBAR-based device, the resonant frequency of the device usually has to be controlled to within a 0.2–0.5% tolerance. This means that the thickness of each layer in the device must be controlled in the same way. It is known that, however, the deposition of thin-film layers is difficult to control to yield a thickness within such tolerance when the area of substrate or wafer is large. For that reason, manufacturers of FBAR-based devices use wafers of 4-inches or less in diameter for device fabrication. With a small wafer or substrate, certain thickness non-uniformity can be accepted without losing many components due to the operation frequency being out of specification. However, fabricating devices on small wafers or substrates is less cost-effective than doing the same on large substrates. In the case of using large substrates, the problem associated with thickness non-uniformity becomes acute.

Thus, it is advantageous and desirable to provide a method and system to solve the problem associated with thickness non-uniformity in the fabrication of FBAR-based devices on large substrates or wafers.

SUMMARY OF THE INVENTION

It is a primary object of the present invention to provide a method and system for achieving the desired resonant frequency of the device within a certain tolerance. This object can be achieved by correcting for the thickness non-uniformity of the devices fabricated on large substrates. The thickness variations can be corrected by selectively removing material from or adding material to the surface area of a wafer (with one or more layers of the device already deposited thereon), or die, before the wafer is cut into individual chips. In that context, the bulk acoustic wave device, as described herein, refers to the entire wafer or substrate that has one or more layers deposited thereon to form one or more individual chips, or part of such wafer or substrate. Moreover, the bulk acoustic wave devices referred to herein include bulk acoustic wave resonators, stacked crystal filters, any combination of the resonators and filters, and the structural variations of the resonators and filters. Furthermore, although one or more layers are already formed on the substrate, the device may or may not have all the necessary layers or the patterns of the layers. For example, the topmost layer on the substrate may be the piezoelectric layer, the top electrode or another layer.

Thus, according to the first aspect of the present invention, a method of tuning a bulk acoustic wave device comprising a substrate and a plurality of acoustic wave generating and controlling layers formed on the substrate, wherein the device has a surface and a thickness, and wherein the device has an operating frequency which varies partly with the thickness of the device and the operating frequency can be adjusted by changing the thickness of the device. The method comprises the steps of:

providing, adjacent to the device, a mask having an aperture;

providing a beam of particles through the aperture for allowing the particles to make contact with the surface of the device in a contacting area substantially defined by the aperture for changing the thickness of the device; and relocating the aperture of the mask substantially in a lateral direction relative to the device surface for changing the contacting area.

It is preferred that the aperture be larger than one individual chip or a single resonator or filter so that a sufficiently large portion of the device surface is exposed to the beam at once. It is possible, however, to have a small aperture so that only one or two chips or a portion of a chip on the device is exposed to the beam simultaneously.

It is preferable to change the thickness by adding the particles to the contacting area of the device surface. It is also possible to change the thickness by using the particles to remove part of the device surface at the contacting area in a drying etching process.

It is preferable to change the thickness of the device by changing the thickness of the piezoelectric layer. It is also possible to change the thickness of the top electrode or the passivation layer.

Preferably, prior to thickness adjustment, the wafer is mapped to determine the non-uniformity profile of the device surface. Such mapping can be carried out by measuring the frequency of localized areas of the device, or by measuring the thickness of the layer stack. From the mapping result, it is possible to calculate the amount of material to be added to or removed from the device surface as a function of location.

It is understood that if the thickness of the piezoelectric layer is adjusted according to the described method, then a top electrode layer is deposited on the piezoelectric layer after the thickness adjustment. It may be necessary to adjust the thickness of the top electrode layer using the same method. Additionally, a patterning step is usually necessary to produce a desired pattern for the electrode layer. The patterning step is not part of the present invention. Furthermore, if a passivation layer is deposited on top of the patterned top-electrode layer, it may be necessary to adjust the thickness of the passivation layer. Thus, the thickness adjustment steps, according to the present invention, may be carried out one or more times for tuning the entire device, if necessary.

According to the second aspect of the present invention, a system for tuning a bulk acoustic wave device comprising a substrate and a plurality of acoustic wave generating and controlling layers formed on the substrate, wherein the device has a surface and a thickness, and wherein the bulk acoustic wave device has an operating frequency, which varies partly with a thickness of the device, and the operating frequency can be adjusted by changing the thickness of the device. The system comprises:

a mask having an aperture located adjacent to the device;

a source for providing a beam of particles through the aperture for allowing the particles to make contact with the device surface in a contacting area about the aperture for changing the thickness of the device and means, for relocating the aperture of the mask substantially in a lateral direction relative to the device surface for changing the contacting area.

Preferably, the system also comprises a mechanism of mapping the thickness non-uniformity profile of the device surface prior to adjusting the thickness. Preferably, the mapping mechanism comprises a frequency measurement device for measuring the frequency at different locations of the device surface. It is also possible to use a thickness measurement device to determine the amount of material to be added or removed at different locations.

The present invention will become apparent upon reading the description taken in conjunction with FIGS. 2 to 9.

DETAILED DESCRIPTION OF THE INVENTION

Figure 2:
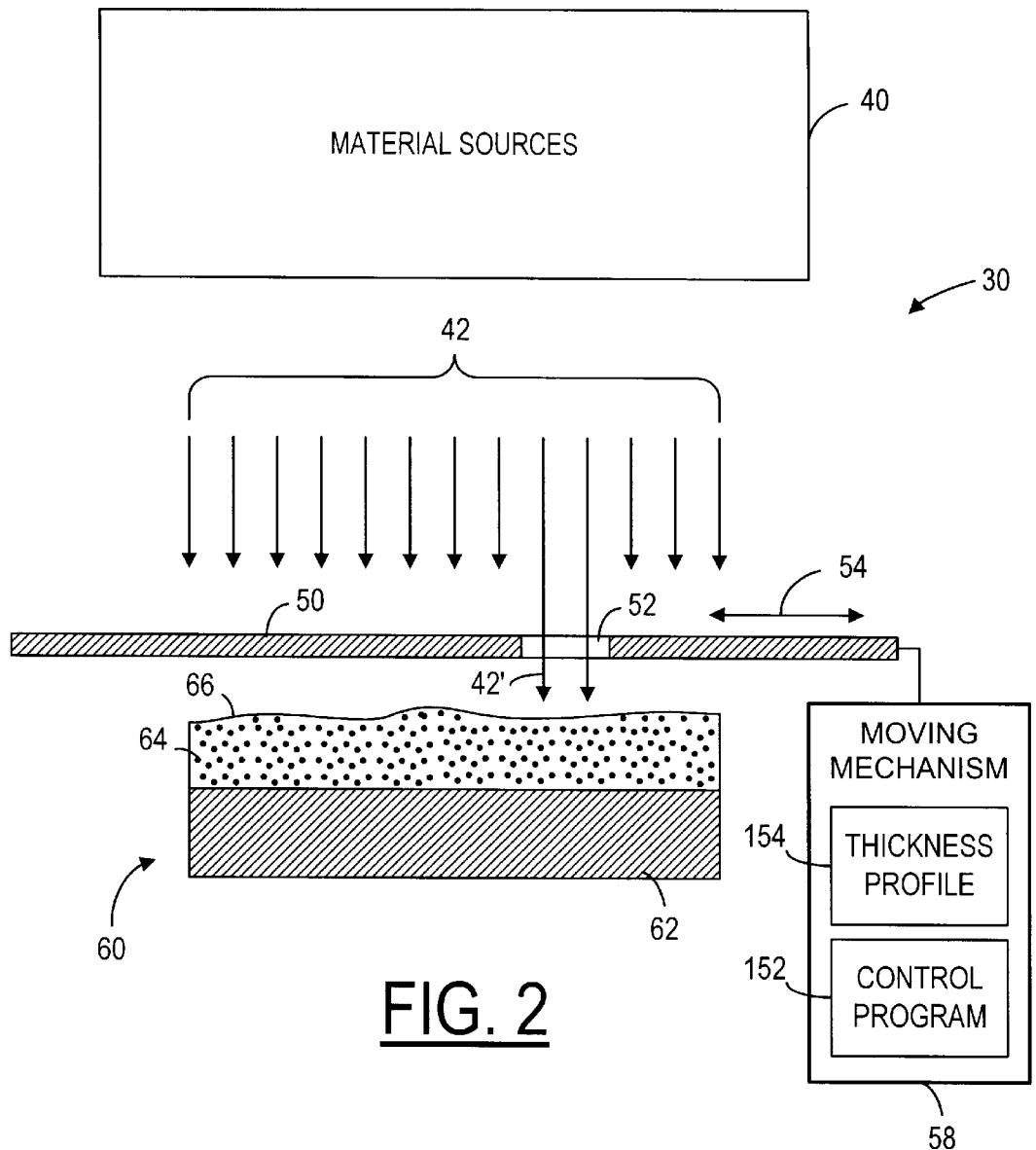
FIG. 2 is a diagrammatic representation illustrating a thickness adjustment system for adding material onto the topmost layer of a bulk acoustic wave device, according to the present invention.

Referring to FIG. 2, the thickness adjustment system 30 comprises a material source 40 to provide added material to a thin-film bulk acoustic device 60 fabricated on a wafer or substrate 62. The layers on top of the substrate 62 are collectively referred to as the upper layers and denoted by reference numeral 64. The upper layers 64 have a top surface 66. As shown in FIG. 2, the thickness of the upper layers is not uniform. It should be understood that the bulk acoustic device 60 may comprise a plurality of individual BAW chips (not shown) each containing one or more resonators and filters. Because of the thickness non-uniformity of the surface 66, some of the individual BAW chips may not meet a specification regarding their resonant frequency. Thus, these individual BAW chips must be tuned. Two tuning methods are disclosed herein. The first method involves adding material to the upper surface 66 to fill in the thinner areas of the upper layers 64. The other method involves removing part of the upper surface 66, as described in conjunction with FIGS. 5 and 6 below. The material source 40 is used to provide a beam of particles collectively denoted by reference numeral 42. A mask 50 having an opening or aperture 52 is placed over the bulk acoustic device 60 so that only a portion 42' of the beam 42 can reach the upper surface 66 in a controlled manner. The mask 50 is moved by a moving mechanism 58 in a lateral direction relative to the upper surface 66, as denoted by the arrow 54, so that the entire surface area of the upper layers 64 can be exposed to the particle beam 42 if necessary. It is preferred that the thickness of the device 60, or the topography of the upper surface 66, is mapped by a mapping mechanism (FIGS. 7a and 7b) to determine the non-uniformity profile of the device 60. It is preferred that the non-uniformity profile is determined from measuring the resonant frequency at different surface localities of the device 60, but it is possible to measure the thickness by a thickness measuring means. The non-uniformity profile of a wafer (with one or more bulk acoustic generation and control layers fabricated thereon) is shown in FIG. 8. Based on the non-uniformity profile, it is possible to control the movement of the mask 60 by programming the moving mechanism 58, so that the "dwell time" of the aperture at each location over the upper surface 66 is determined based on the amount of material to be added onto the surface at that location. As shown, the thickness profile is denoted by reference numeral 154 and the control program is denoted by reference numeral 152. A thickness map representing the non-uniformity profile 154 of a piezoelectric layer across a wafer 60 s shown in FIG. 8. It is preferred that the particle flux of the beam 42 is substantially constant during the thickness adjustment process. It is also possible, however, to vary the flux of the beam 42 according to the non-uniformity profile.

Figure 3:
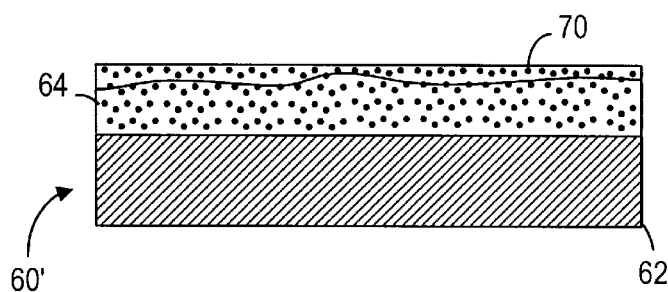
FIG. 3 is a diagrammatic representation illustrating a bulk acoustic wave device after thickness adjustment by adding material from the topmost surface.

FIG. 3 illustrates an adjusted bulk acoustic device 60'. As shown, a layer of added material 70 on top of the upper layers 64 renders the thickness of the device 60' substantially uniform throughout the device. It is preferred that the added material is the same as the material of the layer directly beneath it. For example, if the topmost layer of the upper layers 60' is a passivation layer when the device 60 is subject to thickness adjustment, it is preferable to use the same passivation material for the particle beam 42. However, this practice is only preferred, not necessary.

Figure 1:
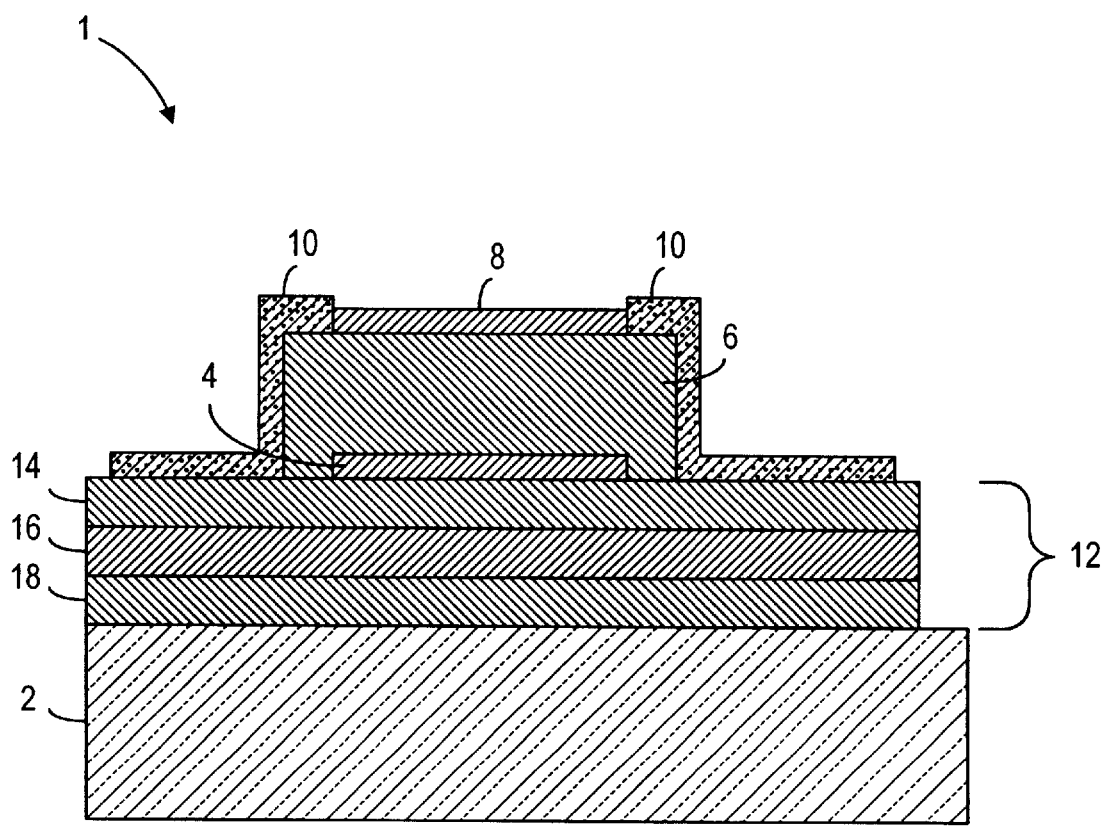
FIG. 1 is a cross sectional side view of a typical bulk acoustic wave device illustrating a plurality of layers formed on a substrate.
Figure 4:
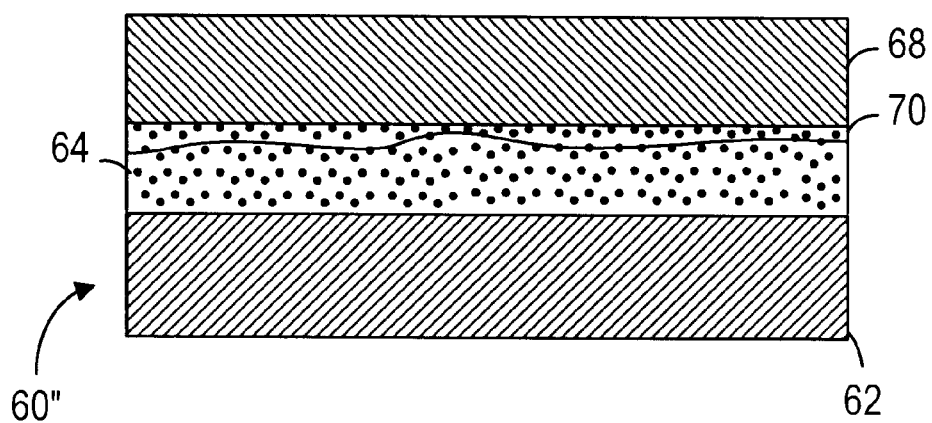
FIG. 4 is a diagrammatic representation illustrated a bulk acoustic wave device that has one or more layers fabricated over top of the modified layer.

It should be noted that, among the different layers in a FBAR-based device, the thickness profile of the piezoelectric layer may be the most important factor that determines whether the device meets its specification. As shown in FIG. 1, the topmost layer of a bulk acoustic device usually is not a piezoelectric layer. It is, however, possible to adjust the thickness of the piezoelectric layer in a manner, as described in conjunction with FIGS. 2 and 3, and then add more layers on top of the adjusted piezoelectric layer to complete the device fabrication process. As shown in FIG. 4, one or more layers 68 can be formed over the adjusted upper layer 64. Furthermore, if the thickness of the new layers 68 is not uniform such that it affects the overall performance of the device, it is possible to adjust the thickness of the new layer 68, using the same process if so desired.

Figure 5:
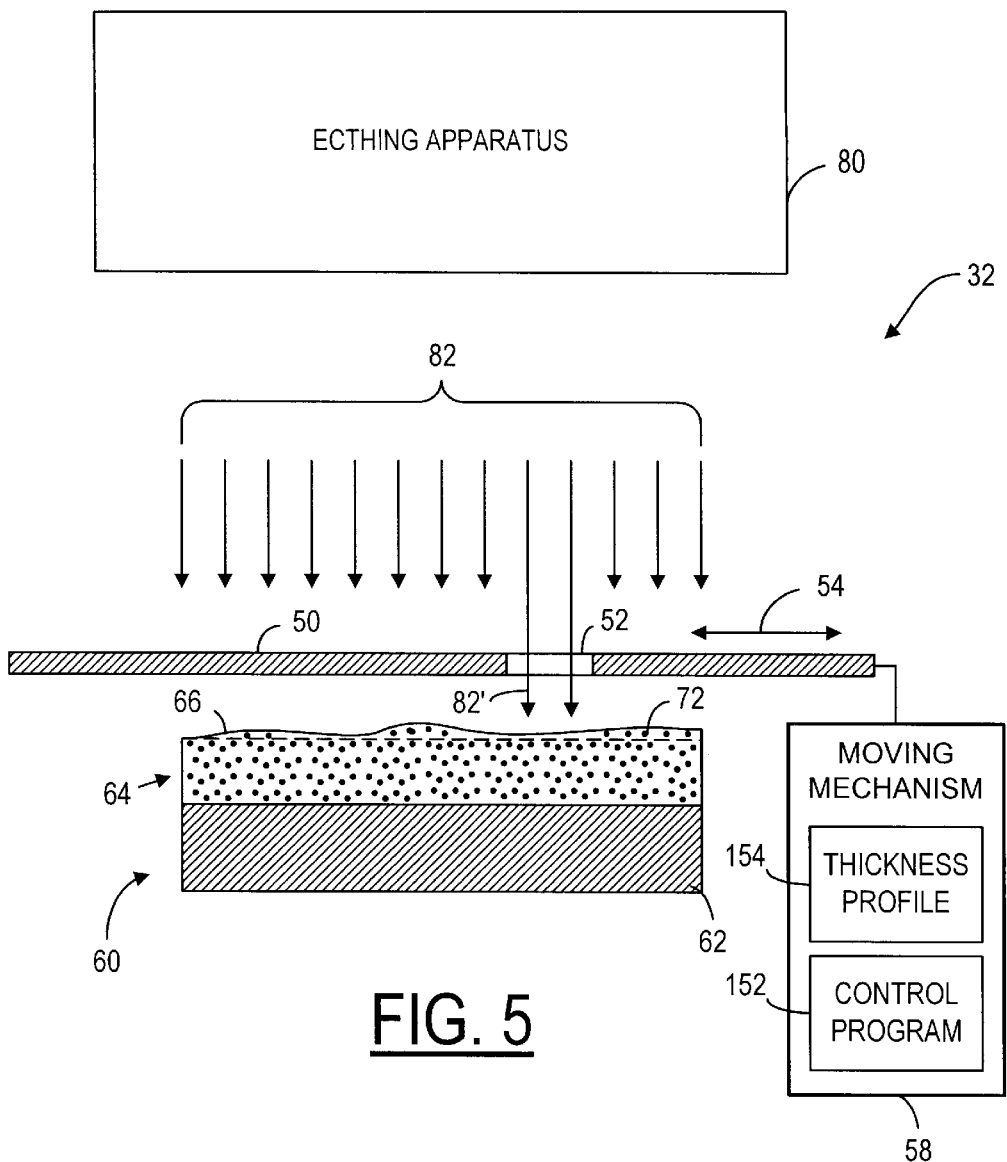
FIG. 5 is a diagrammatic representation illustrating a thickness adjustment system for removing material from the topmost layer of a bulk acoustic wave device, according to the present invention.
Figure 6:
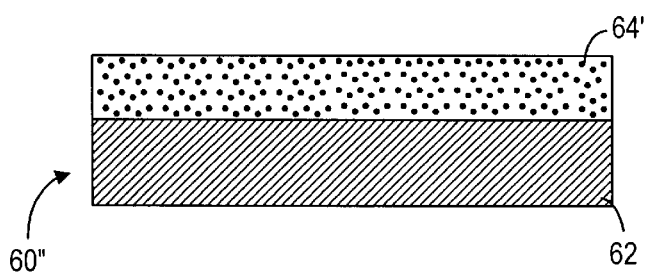
FIG. 6 is a diagrammatic representation illustrating a bulk acoustic wave device after thickness adjustment by removing material from the topmost surface.
Figure 7A:
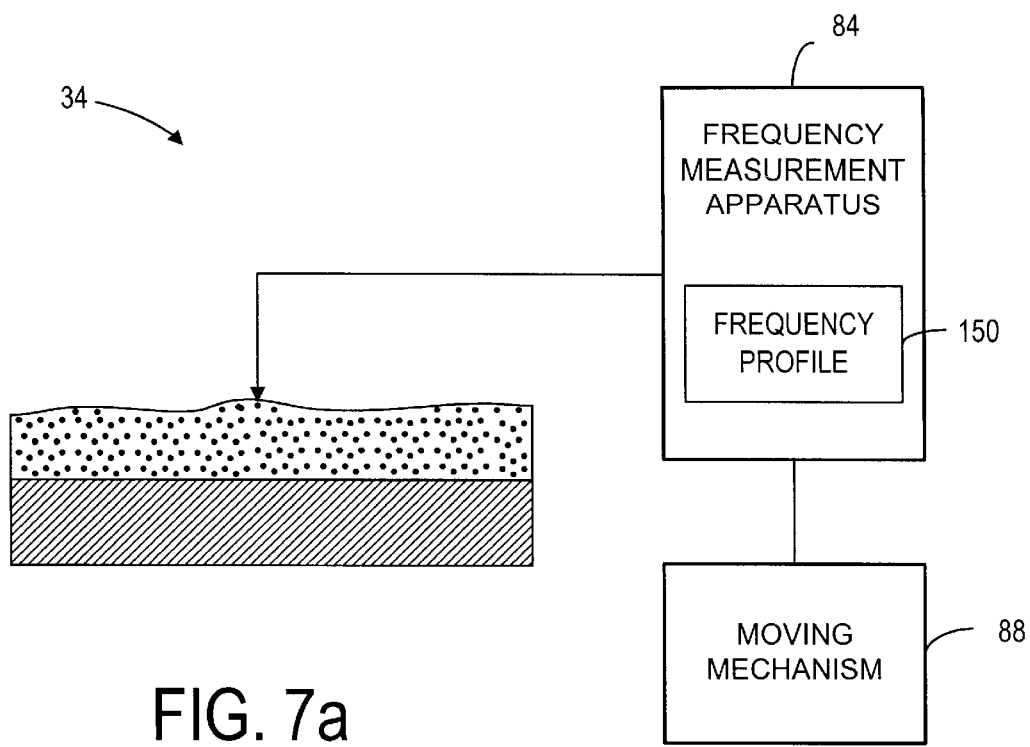
FIG. 7a is a diagrammatic representation illustrating a system for mapping a bulk acoustic wave device by measuring the resonant frequency, according the present invention.

FIG. 5 illustrates a different thickness adjustment system 32. Instead of using a material source 40 for adding material on the upper layers 64, it is possible to use an etching apparatus 80 to remove part of the upper surface 66 of the device 60. For example, it is possible to use an ion beam etching (IBE) apparatus or a reactive ion beam (RIBE) apparatus to provide a beam of ions 82 over the mask 50, such that a portion 82' of the beam 80 can make contact with the upper surface 66 through the aperture 52. The ion beam portion 82' is used to remove the excess portion 72 of the upper surface 66. Besides IBE and RIBE, other etching techniques, such as sputtering and laser ablation, can also be used to surface thickness adjustment through the aperture 52 of the mask 50. The modified device 60" is shown in FIG. 6. As shown, the upper layer 64', after adjustment, is thinner than the original upper layer 64. Thus, when an etching apparatus 80 is used for surface thickness adjustment, the upper layer 64 should be made thicker than the specified or targeted thickness. On the contrary, when a material source 40 is used for surface adjustment, as shown in FIG. 2, the upper layer 64 should be made thinner than the specified or targeted thickness.

Prior to thickness adjustment using a material source 40, as shown in FIG. 2, or an etching apparatus 80, as shown in FIG. 5, it is preferred that the thickness profile be mapped. It is preferable to use a frequency measurement apparatus 84 to perform localized measurement of the resonant frequency of the device 60. It may be necessary to measure the resonant frequency of the individual resonators and filters of the device 60. It should be noted that, in order to measure the resonant frequency of those components, it is necessary to form and pattern the top electrode layer on the wafer. Base on the frequency profile 150, it is possible to calculate the amount of material to be removed from or added on the upper surface 66. As shown in FIG. 7a, the profile mapping system 34 comprises a frequency measurement apparatus 84, and a moving mechanism 88 for moving the frequency measurement apparatus 84 relative to the device 60 for obtaining the frequency profile 150 of the surface. From the frequency profile 150 it is possible to obtain the thickness non-uniformity profile 154 (FIGS. 2 and 5).

Figure 7B:
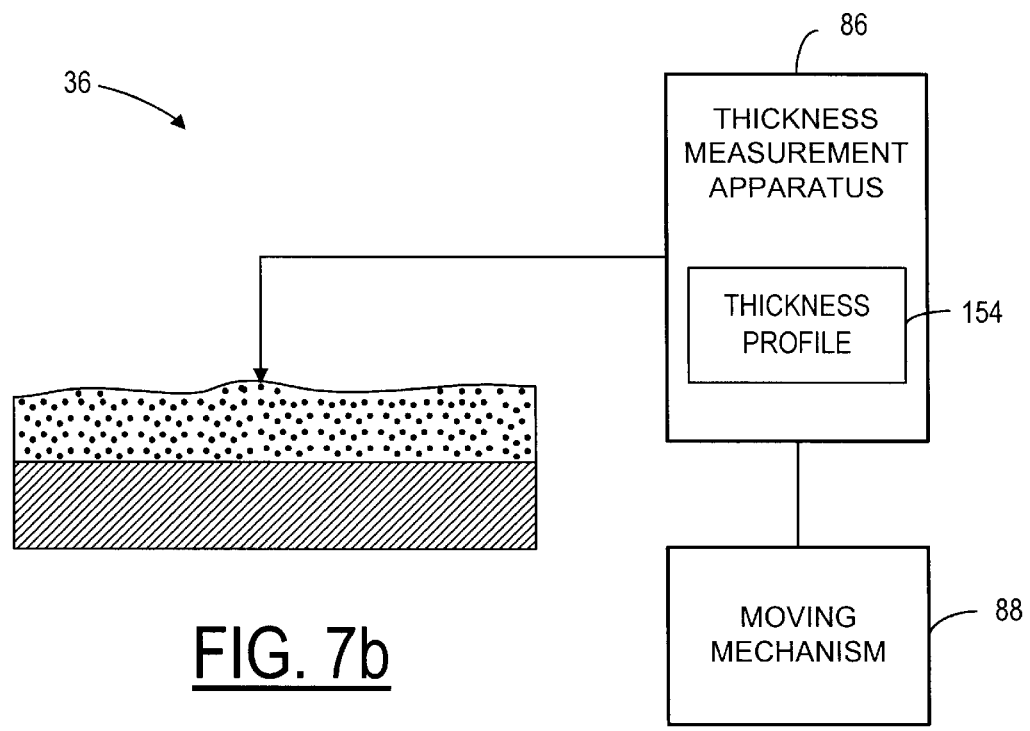
FIG. 7b is a diagrammatic representation illustrating a system for mapping a bulk acoustic wave device by measuring the physical thickness of the device, according to the present invention.
Figure 8:
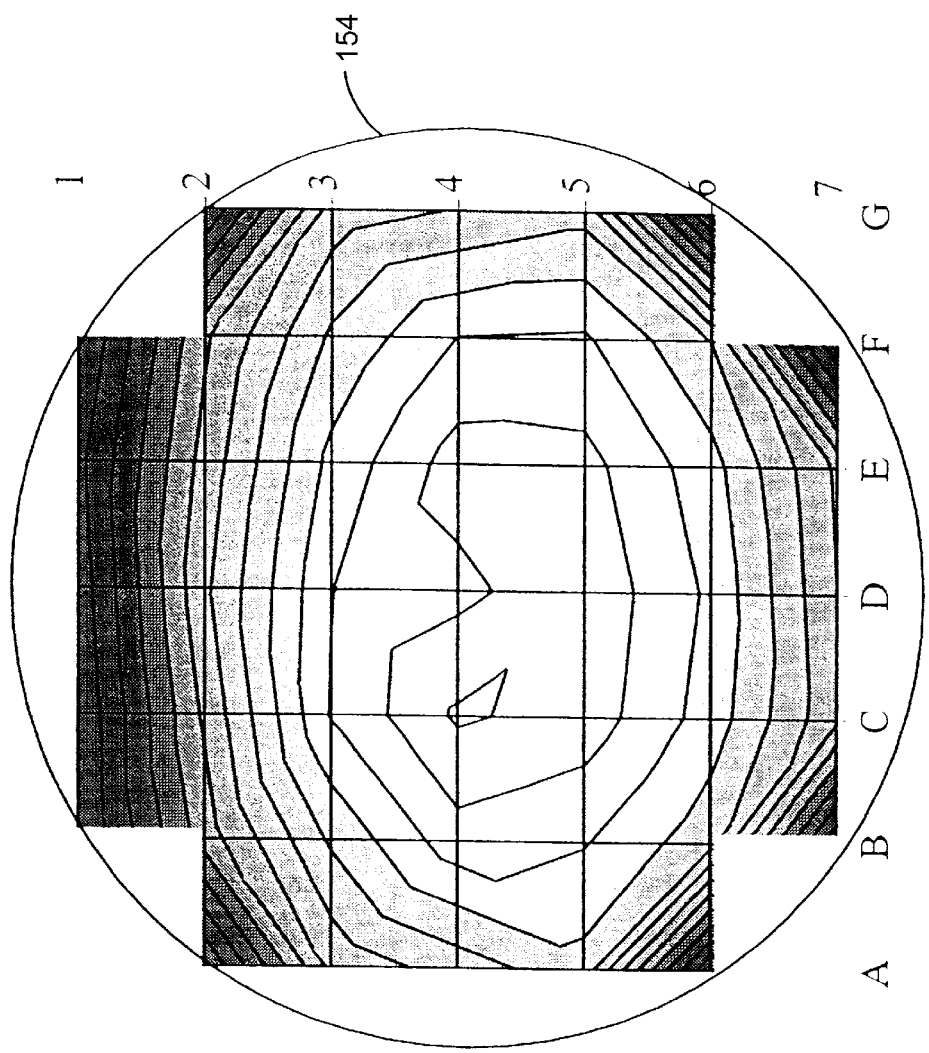
FIG. 8 is a thickness chart illustrating the non-uniformity thickness profile of a wafer with a plurality of acoustic wave generator and control layers fabricated thereon.

FIG. 7b is a diagrammatic representation illustrating a system 36 for mapping a bulk acoustic wave device by measuring the physical thickness of the device. Instead of a frequency measurement apparatus 84, a thickness measurement apparatus 86 is used to measure the thickness of the device 60 directly.

FIG. 8 is a thickness chart illustrating the non-uniformity thickness profile of a wafer with a plurality of acoustic wave generating and controlling layers fabricated thereon. In particular, FIG. 8 shows the non-uniformity profile of a piezoelectric (ZnO) layer expressed in terms of nanometers. If the average thickness is used as a reference, then the thickness variation across the layer is about ±23%. With such a large variation in thickness, the frequency variation across the wafer is usually not acceptable. Thus, the device must be tuned by adjusting the thickness of the device.

Figure 9:
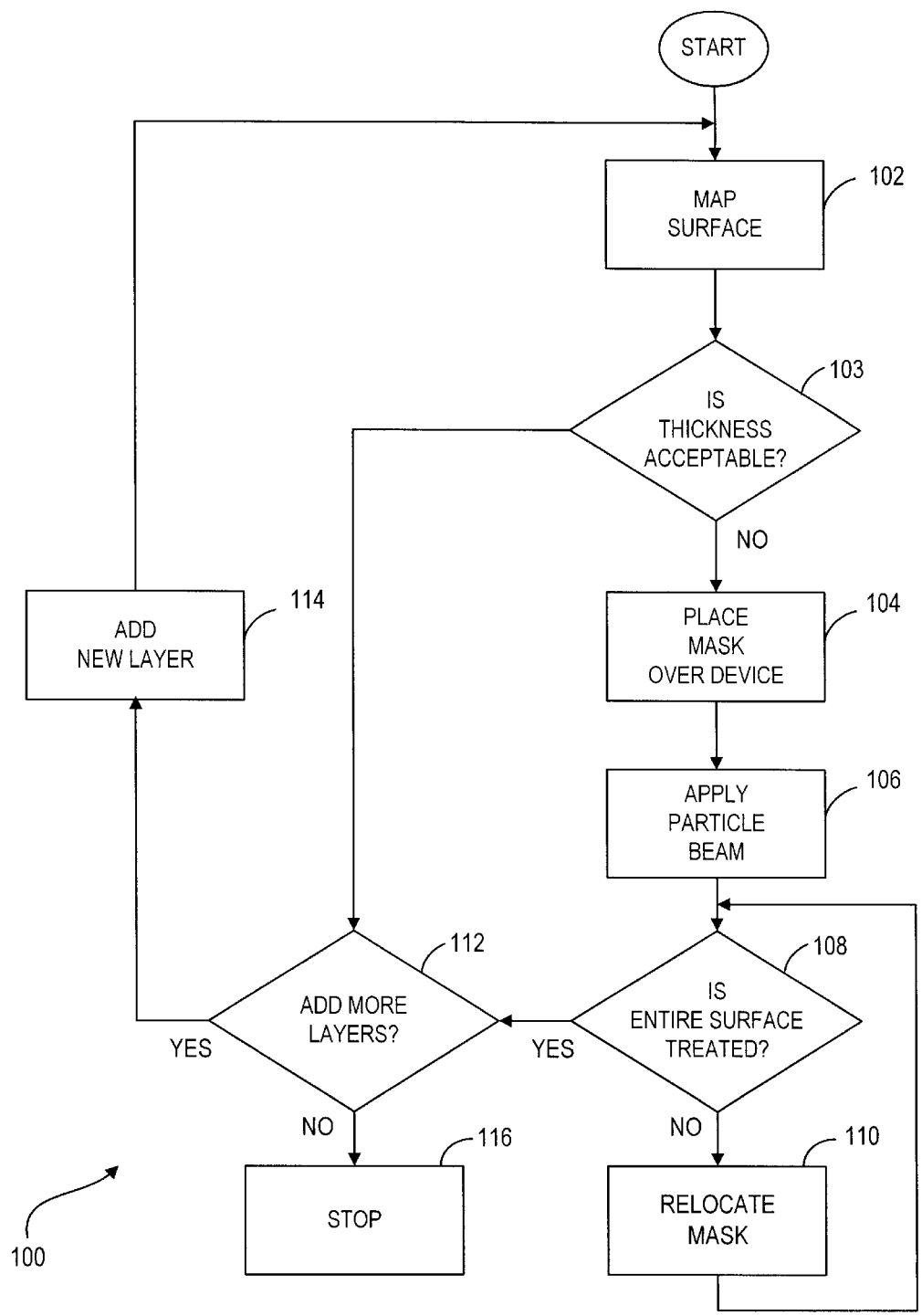
FIG. 9 is a flow chart illustrating the steps for tuning a bulk acoustic wave device, according to the present invention.

FIG. 9 is a flow chart illustrating the process 100 for tuning a bulk acoustic wave device, according to the present invention. As shown, at step 102, a frequency measurement apparatus (FIG. 7a) or a thickness measurement apparatus (FIG. 7b) is used to map the surface of the device 60. A thickness non-uniformity profile 154 is thus obtained. If the surface thickness falls within the tolerance, as determined at step 103, then new layers may be added on top of the mapped surface. Otherwise, a mask 50 with an aperture 52 is placed over the device 60 (FIGS. 2 and 5) at step 104. A beam of particles is applied over the mask 50 to allow part of beam to go through the aperture 52 to make contact with the device surface at a local area, at step 106. After the thickness of the local area is adjusted using the particle beam, it is determined, at step 108, whether the necessary thickness adjustment of the entire surface is carried out. If the thickness of more surface area needs to be adjusted, the mask 50 is moved to another unadjusted location, at step 110. If the necessary thickness of the entire surface has been carried out, it is determined, at step 112, whether more layers need to be fabricated to complete the device. After one or more new layers are added, at step 114, on top of the adjusted layer, the surface profile of the device is again mapped, at step 102, to determine whether the device is made according to the specification.

In summary, the present invention discloses a method and system for tuning the bulk acoustic wave device at a wafer, or die, level. The method and system, as disclosed, are particularly useful when the surface area of the wafer is sufficiently large such that the deposition of thin-film cannot achieve acceptable thickness uniformity. Trimming the frequency across the wafer by adjusting the thickness at localized areas of the wafer surface can increase the yield of the FBAR manufactory process. The thickness adjustment process can be separately and sequentially carried out to adjust at one or more layers of the FBAR-based device. If a material is added onto a surface layer to trim the frequency and a material source is used to provide a beam of particles, it is preferable that the particles and the surface layer are of the same material. However, the material for the particles and the material for the surface layer may not be the same. If the material of the surface layer is partially removed to trim the frequency, it is preferred to use a dry etching process, such as IBE or RIBE, to trim the surface. However, other surface removal process, such as sputtering, can be used to achieve the same objective. It is known in the art that the fabrication of the top and bottom electrode layers, in general, involves one or more additional steps to make a pattern out of each of the electrode layers. It is preferred that the patterning steps are carried out after the thickness of the respective electrode layer is adjusted. However, it is also possible to carry out the patterning steps prior to the thickness adjustment.

Furthermore, the mask, as described hereinabove, has one aperture to allow the particle to make contact with the device surface. It is possible to have two or more apertures on the mask for surface thickness adjustment. Moreover, it is possible to move the mask relative to the device to relocate the aperture on the mask. It is also possible to move the device relative to mask to achieve the same.

Thus, although the invention has been described with respect to a preferred embodiment thereof, it will be understood by those skilled in the art that the foregoing and various other changes, omissions and deviations in the form and detail thereof may be made without departing from the spirit and scope of this invention.

What is claimed is:

1. A method of tuning a bulk acoustic wave device made from a plurality of acoustic wave generating and controlling layers formed on a substrate, wherein the bulk acoustic wave device has a surface and a thickness, and wherein the bulk acoustic wave device has an operating frequency which varies partly with a thickness, and the operating frequency can be adjusted by changing the thickness of the device, said method comprising the steps of:

providing, adjacent to the device surface, a mask having an aperture;

providing a beam of particles over the mask for allowing at least part of the particle beam to pass through the aperture to make contact with the device surface in a contacting area substantially defined by the aperture for changing the thickness of the device; and engaging the mask for relocating the aperture substantially in a lateral direction relative to the device surface for changing the contacting area.

2. The method of claim 1, wherein some of the particles in said part of the particle beam are deposited on the device surface, thereby increasing the thickness of the device substantially at the contacting area.

3. The method of claim 1, wherein the layers comprise a topmost layer away from the substrate, and wherein the mask is located adjacent to the topmost layer for allowing said at least part of the particle beam to make contact with the topmost layer at the contacting area.

4. The method of claim 3, wherein the topmost layer is made from a surface material and the particles comprise the layer material.

5. The method of claim 3, wherein the topmost layer comprises an electrode layer.

6. The method of claim 3, wherein the topmost layer comprises a passivation layer.

7. The method of claim 3, wherein the topmost layer comprises a piezoelectric layer.

8. The method of claim 1, wherein the surface is made of a surface material and said at least part of the particle beam removes some surface material, thereby reducing the thickness of the device substantially at the contacting area.

9. The method of claim 1, wherein the bulk acoustic wave device comprises a film bulk acoustic wave resonator.

10. The method of claim 1, wherein the bulk acoustic wave device comprises a film bulk acoustic wave filter.

11. The method of claim 1, wherein the bulk acoustic wave device comprises a plurality of individual bulk acoustic wave device chips.

12. A method of tuning a bulk acoustic wave device made from a plurality of acoustic wave generating and controlling layers formed on a substrate, wherein the bulk acoustic wave device has a surface and a thickness, and wherein the bulk acoustic wave device has an operating frequency which varies partly with a thickness, and the operating frequency can be adjusted by changing the thickness of the device, said method comprising the steps of:

providing, adjacent to the device surface, a mask having an aperture;

providing a beam of particles over the mask for allowing at least part of the particle beam to pass through the aperture to make contact with the device surface in a contacting area substantially defined by the aperture for changing the thickness of the device; and relocating the aperture of the mask substantially in a lateral direction relative to the device surface for changing the contact area, wherein the thickness of the device has a non-uniformity profile across the device surface, and wherein the tuning steps are used to reduce the non-uniformity.

13. The method of claim 12, further comprising the step of mapping the device surface for determining the non-uniformity profile, and the moving step is based on the non-uniformity profile.

14. The method of claim 13, wherein the mapping step is carried out by measuring the resonant frequency of the device across the device surface.

15. The method of claim 13, wherein the mapping step is carried out by measuring the thickness of the acoustic wave generating and controlling layers.

16. A system for tuning a bulk acoustic wave device made from a plurality of acoustic wave generating and controlling layers formed on a substrate, wherein the bulk acoustic wave device has a surface and a thickness, and wherein the bulk acoustic wave device has an operating frequency which varies partly with the thickness, and the operating frequency can be adjusted by changing the thickness of the device, said system comprising:

a mask having an aperture placed adjacent to the device surface;

means, for providing a beam of particles over the mask for allowing at least part of the particle beam to pass through the aperture to make contact with the device surface in a contacting area substantially defined by the aperture for changing the thickness of the device; and means, engaging with the mask, for relocating the aperture of the mask substantially in a lateral direction relative to the device surface for changing the contacting area.

17. The system of claim 16, wherein the thickness of the device is represented by a thickness non-uniformity profile, said system further comprising a software program for controlling said relocating means according to the thickness non-uniformity profile for reducing surface non-uniformity.

18. The system of 16, wherein some of the particles in said part of the particle beam are deposited on the device surface, thereby increasing the thickness of the device substantially at the contacting area.

19. The system of claim 16, wherein the layers comprise a topmost layer away from the substrate, and wherein the mask is located adjacent to the topmost layer for allowing said at least part of the particle beam to make contact with the topmost layer at the contacting area.

20. The system of claim 19, wherein the topmost layer is made from a surface material and the particles comprise the layer material.

21. The system of claim 16, wherein the surface is made of a surface material and said at least part of the particle beam removes some surface material, thereby reducing the thickness of the device substantially at the contacting area.

22. The system of claim 16, wherein the particles comprise a plurality of ions.

23. The system of claim 16, wherein the particles comprise a plurality of reaction ions.

24. The system of claim 16, wherein the thickness of the device has a non-uniformity profile across the device surface, said system further comprises a mapping mechanism for obtaining the non-uniformity profile by mapping the device surface.

25. The system of claim 24, wherein the mapping mechanism comprises a frequency measurement device for determining the local resonant frequency of the device across the device surface.

26. The system of claim 24, wherein the mapping mechanism comprises a thickness measurement device.

27. The system of claim 24, wherein said relocating means has a control mechanism for relocating the aperture based on the non-uniformity profile.

28. The system of claim 16, wherein the device comprises a plurality of individual chips each having a chip surface area, and wherein the aperture is larger than the chip surface area.

29. The system of claim 16, wherein the device comprises a plurality of individual chips each having a chip surface area, and wherein the aperture is smaller than the chip surface area.

* * * * *

UNITED STATES PATENT AND TRADEMARK OFFICE
CERTIFICATE OF CORRECTION

PATENT NO.     : 6,456,173 B1
DATED          : September 24, 2002
INVENTOR(S)    : Ellä et al.

It is certified that error appears in the above-identified patent and that said Letters Patent is hereby corrected as shown below:

<u>Title page,</u>
Item [57], ABSTRACT,
Line 4, after "across", replace "the device" with -- its --.

Signed and Sealed this

Eighteenth Day of March, 2003

JAMES E. ROGAN
*Director of the United States Patent and Trademark Office*